(12) United States Patent
Agrawal et al.

(10) Patent No.: US 11,024,353 B1
(45) Date of Patent: Jun. 1, 2021

(54) MECHANISM TO IMPROVE DRIVER CAPABILITY WITH FINE TUNED CALIBRATION RESISTOR

(71) Applicant: WESTERN DIGITAL TECHNOLOGIES, INC., San Jose, CA (US)

(72) Inventors: Ankur Agrawal, Karnataka (IN); Simarpreet Kaur, Karnataka (IN)

(73) Assignee: WESTERN DIGITAL TECHNOLOGIES, INC., Irvine, CA (US)

( * ) Notice: Subject to any disclaimer, the term of this patent is extended or adjusted under 35 U.S.C. 154(b) by 0 days.

(21) Appl. No.: 16/858,223

(22) Filed: Apr. 24, 2020

(51) Int. Cl.
*G11C 7/10* (2006.01)
*G11C 8/06* (2006.01)
*G11C 13/00* (2006.01)

(52) U.S. Cl.
CPC .............. *G11C 8/06* (2013.01); *G11C 7/1051* (2013.01); *G11C 13/0002* (2013.01); *G11C 2213/75* (2013.01)

(58) Field of Classification Search
CPC ... G11C 8/06; G11C 13/0002; G11C 2213/75; G11C 7/10; G11C 7/1051
See application file for complete search history.

(56) References Cited

U.S. PATENT DOCUMENTS

| | | | | |
|---|---|---|---|---|
| 7,791,367 B1 * | 9/2010 | Pelley | ............ | H03K 19/018585 326/30 |
| 10,224,928 B1 * | 3/2019 | Mathur | ................ | G11C 7/1051 |
| 2004/0113653 A1 * | 6/2004 | Lundberg | ............ | H03K 19/0005 326/30 |
| 2005/0057275 A1 * | 3/2005 | Ngyuen | ............. | H03K 19/0005 326/30 |
| 2007/0139123 A1 * | 6/2007 | Liu | ................... | H03K 19/00384 330/302 |
| 2007/0152704 A1 * | 7/2007 | Park | ..................... | G11C 7/1051 326/30 |
| 2007/0263459 A1 * | 11/2007 | Kim | ...................... | G11C 7/1051 365/189.11 |
| 2008/0198666 A1 * | 8/2008 | Nygren | ................... | G11C 7/02 365/185.24 |
| 2009/0254925 A1 * | 10/2009 | Ayyapureddi | ........ | G06F 9/4411 719/327 |

(Continued)

*Primary Examiner* — Jay W. Radke
(74) *Attorney, Agent, or Firm* — Arent Fox LLP

(57) ABSTRACT

Aspects of a storage device including a controller, a calibration resistor and a die having an output driver and a calibration circuit are provided, which allow for an output impedance of the output driver to be calibrated to a lower impedance than a minimum required for reading data across PVT variations of the die at maximum loading of the controller. To check whether slow corners may operate using the lower impedance, the controller determines whether the output impedance of the output driver can be calibrated to the lower impedance at a maximum temperature and minimum voltage applied to the die, or whether a calibration code generated from the calibration circuit exceeds a threshold at a nominal temperature and voltage applied to the die. Thus, slow corners are screened out from lower impedance use, while faster devices are designed with a smaller calibration resistance to benefit from increased memory and speed.

20 Claims, 10 Drawing Sheets

(56) References Cited

U.S. PATENT DOCUMENTS

| | | | |
|---|---|---|---|
| 2011/0267900 A1* | 11/2011 | Kim | G11C 7/1084 365/189.07 |
| 2014/0040922 A1* | 2/2014 | Ayyapureddi | G11C 7/1051 719/327 |
| 2015/0067292 A1* | 3/2015 | Grunzke | G11C 7/1057 711/170 |
| 2015/0270010 A1* | 9/2015 | Kang | G11C 29/50008 365/185.22 |
| 2016/0094202 A1* | 3/2016 | Hollis | H03K 19/018585 327/109 |
| 2017/0123446 A1* | 5/2017 | Siddula | G05F 3/245 |

* cited by examiner

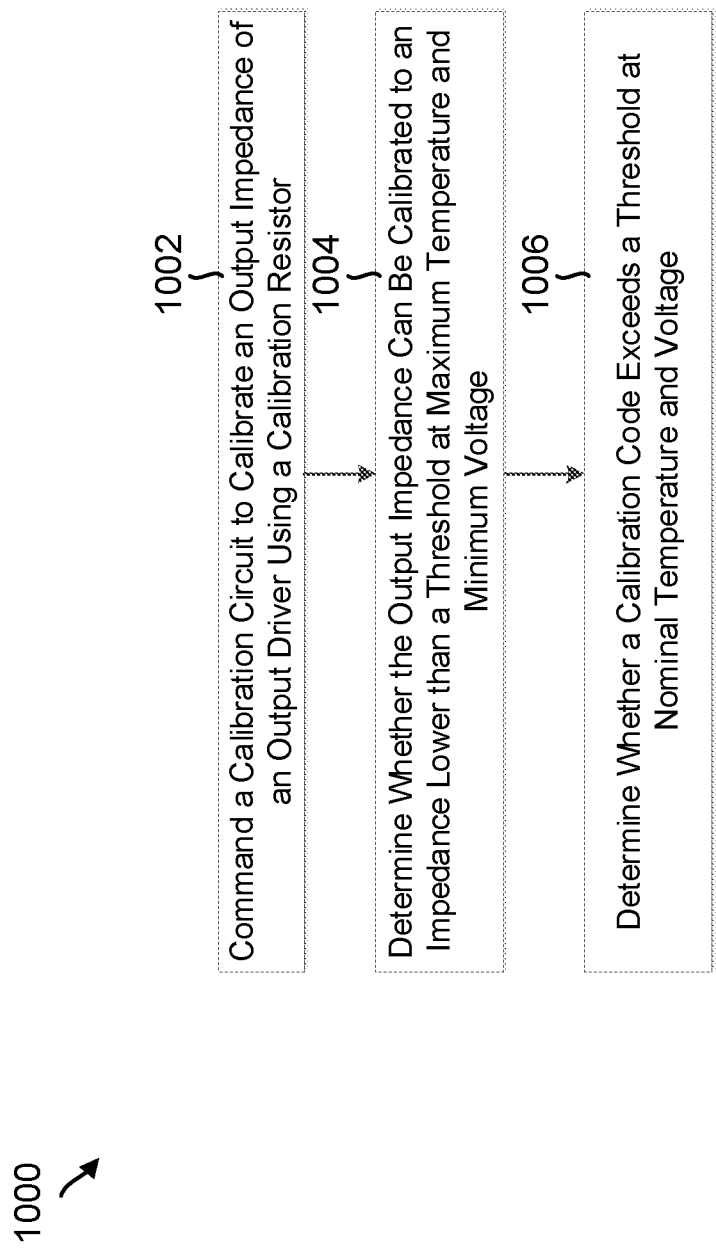

MECHANISM TO IMPROVE DRIVER CAPABILITY WITH FINE TUNED CALIBRATION RESISTOR

BACKGROUND

Field

This disclosure is generally related to electronic devices and more particularly to storage devices.

Background

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. These control tables are used to track the physical location of logical sectors, or blocks, in the flash memory. The control tables are stored in the non-volatile memory to enable access to the stored data after a power cycle.

A die of the flash storage device may include a number of input-outputs (e.g. DQ lines or pins) interfacing with a controller of the flash storage device. Each DQ line may be connected to an output driver, which may pull up output data representing a logic 1 and which may pull down output data representing a logic 0. A calibration resistor (e.g. a ZQ calibration resistor) may also be provided for the controller to calibrate an output impedance of each output driver. This calibration resistor may be configured such that the flash storage device successfully operates across process, voltage, and temperature variations (PVT). For instance, in a flash storage device including 8 dies sharing an 8-bit data bus with the controller, a 300 ohm (Ω) calibration resistor may be used to calibrate each die to a minimum output impedance of 25Ω that allows the controller to correctly read data from the dies at different process corners (e.g. typical, fast-fast, slow-slow, fast-slow, and slow-fast), at different voltages (e.g. input/output power supply voltages (VccQ) between 1.14 V and 1.26 V for non-volatile, double data rate 3 (NV-DDR3) memories), and at different temperatures (e.g. between a minimum operating temperature of −40° C. and a maximum operating temperature of 85° C.). However, as the maximum load to the controller (i.e. the number of dies sharing the bus) and the maximum data output rate over the DQ lines may be limited by the minimum output impedance, such flash storage devices may be limited by the calibration resistor in memory and speed.

SUMMARY

One aspect of a storage device is disclosed herein. The storage device includes a calibration resistor and a die. The die comprises an output driver configured to store output data and having an output impedance, and a calibration circuit configured to calibrate the output impedance of the output driver using the calibration resistor. The calibration resistor has a resistance that enables the calibration circuit to calibrate the output impedance to a lower impedance than a minimum impedance required by a controller to read the stored data across process, voltage and temperature variations of the die at maximum loading of the controller.

Another aspect of a storage device is disclosed herein. The storage device includes a calibration resistor, a die, and a controller. The die comprises an output driver configured to store output data and having an output impedance, and a calibration circuit configured to calibrate the output impedance of the output driver using the calibration resistor. The controller is configured to determine whether the output impedance of the output driver can be calibrated to an impedance lower than a threshold at maximum temperature and minimum voltage.

A further aspect of a storage device is disclosed herein. The storage device includes a calibration resistor, a die, and a controller. The die comprises an output driver configured to store output data and having an output impedance, and a calibration circuit configured to generate a calibration code to calibrate the output impedance of the output driver using the calibration resistor. The controller is configured to determine whether the calibration code exceeds a threshold at nominal temperature and voltage.

It is understood that other aspects of the storage device and method will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein:

FIG. 10 is a flow chart illustrating a method for calibrating an output impedance of an output driver in the storage device of FIG. 1.

DETAILED DESCRIPTION

Figure 1:
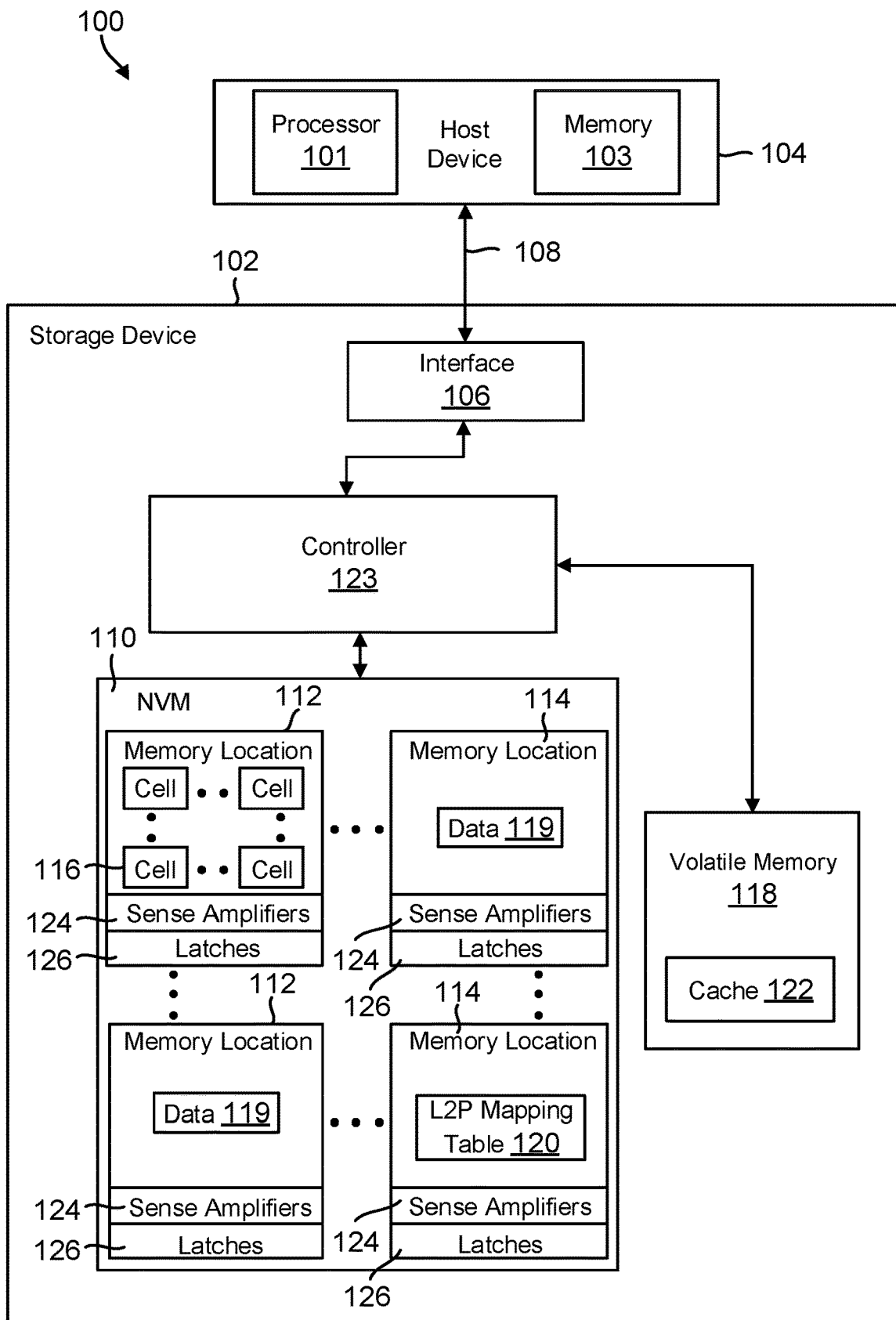
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

In the following detailed description, various aspects of a storage device in communication with a host device will be presented. These aspects are well suited for flash storage devices, such as SSDs and SD cards which include NAND cells to store data. However, those skilled in the art will realize that these aspects may be extended to all types of storage devices capable of storing data, for example, integrated circuits (ICs) that include dynamic random access memory (DRAM), field programmable gate arrays (FPGAs), controllers, etc. Accordingly, any reference to a specific apparatus or method is intended only to illustrate the various aspects of the present invention, with the understanding that such aspects may have a wide range of applications without departing from the spirit and scope of the present disclosure.

When a controller of the storage device reads stored data from a die, the controller may receive individual bits of the data over multiple data outputs (DQs). Each DQ may be connected to an output driver, which may include an array of CMOS transistors including pull up transistors that pull up output data representing a logic 1 and pull down transistors to pull down output data representing a logic 0. Groups of parallel pull-up transistors in the array may be arranged into parallel pull-up legs, and groups of parallel pull-down transistors in the array may be arranged into parallel pull-down legs, as illustrated for example in FIG. 5. For instance, an output driver including a 72-transistor CMOS array may include six parallel pull-up legs each including six parallel pull-up transistors and six parallel pull-down legs each including six parallel pull-down transistors.

A storage device may include multiple dies sharing a bus with the controller, with multiple output drivers including the CMOS arrays subject to process, voltage, and temperature (PVT) variations. For example, due to process variations in oxide thickness, channel length, doping concentration, and other factors during the wafer fabrication process, different dies may operate at different process corners (e.g. typical, fast-fast, slow-slow, fast-slow, and slow-fast). Moreover, due to current-resistance fluctuation (IR drop) and varying amounts of heat at transistor junctions, different dies may experience different input-output (I/O) voltages and temperatures, respectively. Such PVT variations may affect the output impedance or driver strength of each output driver, which may in turn affect the controller's ability to correctly read data from the dies.

Therefore, to account for these PVT variations (and thus varying output impedances), each pull-up leg and pull-down leg may be calibrated such that its output impedance matches an impedance of a pre-configured, calibration resistor (e.g. a ZQ calibration resistor of 300 ohms for NAND or 240 ohms for DRAM). Moreover, multiple, pre-designed pull-up legs and pull-down legs may be selectively enabled to provide different total output impedances, or driver strength settings, for the output driver to support different capacitance loads (e.g. die stacks) based on the pre-configured calibration resistor. For instance, if each pull up leg and pull down leg is calibrated to include an output impedance matching that of the calibration resistor (e.g. 300 ohms), the controller may enable a number of pull up legs and pull down legs (e.g. 12 legs) to result in a minimum, total output impedance (e.g. 25 ohms for NV-DDR3) to support a pre-configured, maximum loading of the controller (e.g. 8 dies or another number). Similarly, a smaller number of pull up legs and pull down legs (e.g. 8 legs or another number) may be enabled to result in a larger total output impedance (e.g. 35 and/or 37.5 ohms) for a smaller loading (e.g. 4 dies or another number), or an even smaller number of pull up legs and pull down legs (e.g. 6) may be enabled to result in an even larger total output impedance (e.g. 50 ohms) for an even smaller loading (e.g. 1 die or another number). The data output speed of each die may also be similarly pre-configured and limited based on the output impedance and/or capacitance load.

Thus, the storage device may support pre-configured driver strengths or output impedances (e.g. 25 ohm, 35 ohm, 37.5 ohm, and 50 ohm) based on a calibration resistor that allows the controller to read stored data across PVT variations of the dies, at pre-configured loads (e.g. 1, 2, 4, or 8 dies) and pre-configured output rates (e.g. 533 mega transfers per second (MT/s) for eight dies). However, in cases where more dies or higher output rates are desired, the pre-configured driver strengths based on the existing calibration resistor may be insufficient to support the resulting higher capacitance loads or speeds. For instance, the output drivers of a 16 die load, even when calibrated to the highest driver strength setting or minimum output impedance for a 300 ohm calibration resistor (e.g. 25 ohms as described above for DDR3), may still not have sufficient capability to successfully drive outputs to the controller across PVT variations of the dies (in contrast to, e.g., an 8 die load).

Therefore, to enable the use of larger memories and higher speeds, the storage device described in the present disclosure includes a calibration resistor that allows the output impedance of the output driver of the die to be calibrated to a lower impedance than the minimum output impedance described above. For example, assume the storage device is preconfigured with a minimum output impedance of 25 ohms (or another number) that allows stored data to be read from eight dies (or another number) across PVT variations (i.e. based on a 300 ohm calibration resistor and twelve enabled pull-up/pull-down legs, as described above). In such case, a calibration resistor having a lower resistance of 240 ohms (or another number) may be provided to calibrate the output impedance of the output drivers to a lower impedance than the minimum (e.g. 20 ohms or another number, assuming twelve enabled pull-up/pull-down legs). In this way, the output impedance may be reduced to increase the drive strength of the output drivers, allowing the controller to read stored data from more dies or at higher speeds. Such approach may be advantageous over increasing the number of fabricated, parallel pull-up and pull-down legs to reduce the output impedance, for example, which may be limited based on the die area.

However, such lower output impedances (e.g. 20 ohms) may not be guaranteed across PVT variations in contrast to the minimum output impedance described above (e.g. 25 ohms). For example, a die which is a slow corner (e.g. SS) may have a larger output impedance for its pull-up or pull-down transistors due to process variations than a die which is a typical or fast corner (e.g. FF). When calibrating the output impedance based on a larger calibration resistor (e.g. 300 ohms), such process variations are accounted for in the design of the storage device. For example, the storage device may be configured with a sufficient number of CMOS transistors (i.e. pull-up and pull-down legs) to calibrate the larger output impedance of even slow corners to the pre-configured, minimum output impedance (e.g. 25 ohms). However, when calibrating the output impedance based on a smaller calibration resistor (e.g. 240 ohms), the number of CMOS transistors may no longer be sufficient. For example, there may not be enough transistors to calibrate the larger output impedance of slow corners to the lower output impedance (e.g. 20 ohms), and increasing the number of transistors in the storage device to compensate for this insufficiency may not be cost-effective or feasible due to limited die area as described above.

Accordingly, a screening process may be implemented which identifies dies that are unable during calibration to achieve the lower output impedance across PVT variations. The screening process may depend on whether the controller is external to the die or internal to the die. In one example of the screening process, an external controller of the storage device may determine whether the output impedance of the output driver of a die can be calibrated to the lower impedance (i.e. lower than a threshold such as the minimum output impedance of 25 ohms described above) in a condition where the die is slowest (i.e. at a maximum operating temperature (e.g. 85° C.) and a minimum voltage (e.g. 1.14 VccQ)). The controller may send a calibration command to the die, which calibrates the output impedance of the output driver of the die to match the impedance of the lower calibration resistor (e.g. 240 ohms). A register (e.g. ZQ_cal_status or another name) may be updated to indicate whether calibration is successful or whether calibration has failed. The controller may determine from the register if calibration is successful or not. If calibration is successful (i.e. the lower impedance of 20 ohms or another number was achieved), the die is determined to operate across PVT variations even with the lower calibration resistor and may accordingly be binned or sorted for products with higher die loads or speeds. If calibration has failed (i.e. the lower impedance of 20 ohms or another number was not achieved), the die is determined not to operate across PVT variations with the lower calibration resistor and may accordingly be binned or sorted for products with lower die loads or speeds. For example, a die with successful calibration may be sorted for use in a 16 die product (larger memory), while a die with failed calibration may be sorted for use in a 8 die or lower configuration product (smaller memory) to achieve similar speeds, e.g. 533 MT/s. Also, a die with successful calibration may help increase the transfer speed within the same configuration product.

In another example, if the controller is internal to the die, the controller may access a calibration code used to calibrate the output impedance of the output driver in a register (e.g. ZQ cal or another name). The calibration code may indicate which parallel pull-up or pull-down transistors in a parallel pull-up or pull-down leg are activated to match the output impedance with the impedance of the lower calibration resistor (e.g. 240 ohms or another number) during a successful calibration. For instance, assuming each pull-up/pull-down leg of the output driver includes six parallel transistors, a calibration code of six bits (i.e. 63 different calibration codes excluding 000000) may be generated during calibration, and if alternating transistors corresponding to the calibration code 101010 are activated to successfully calibrate output impedance, the register may store the code 101010. Moreover, in this example, when dies are tested on a wafer, a characterization process may be implemented in which slow corners are tested for successful calibration using the lower calibration resistor (e.g. 240 ohms) at different voltages and temperatures (VT). Based on the results of the characterization, a calibration code threshold may be identified which indicates a maximum calibration code (a maximum or threshold binary value) that enables successful calibration across VT variations. For instance, if calibration code 111000 (or some other code) is identified during testing to be the highest calibration code that allows the output impedance to be successfully reduced to 20 ohms even at a maximum operating temperature (e.g. 85° C.) and a minimum voltage (e.g. 1.14 VccQ), the calibration code threshold may be set as that code.

Accordingly in this other example of the screening process, the internal controller may determine whether the calibration code (e.g. 101010) used to successfully perform calibration of the die to the lower output impedance (e.g. 20 ohms) exceeds the calibration code threshold (e.g. 111000) at a nominal temperature and voltage (e.g. 25° C. and 1.2 VccQ). For instance, after sending a calibration command to the die, the controller may read the ZQ_cal register (or another name) to identify the calibration code which was used to successfully perform the calibration at nominal voltage and temperature conditions. If the identified calibration code does not exceed the calibration code threshold, the die is determined to operate across PVT variations even with the lower calibration resistor and may accordingly be binned or sorted for products with higher die loads or speeds. If the identified calibration code exceeds the calibration code threshold, the die is determined not to operate across PVT variations with the lower calibration resistor and may accordingly be binned or sorted for products with lower die loads or speeds. For example, a die with a smaller calibration code may be sorted for use in a 16 die product (larger memory), while a die with a larger calibration code may be sorted for use in a 8 die or lower configuration product (smaller memory) to achieve similar speeds, e.g. 533 MT/s. Also, a die with a smaller calibration code may help increase the transfer speed within the same configuration product. Alternatively, the internal controller may perform the same process as the external controller in the other example of screening described above.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/ laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

As shown in the exemplary embodiment of FIG. 1, the storage device 102 includes non-volatile memory (NVM) 110 for non-volatilely storing data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the illustrated exemplary embodiment of FIG. 1, each memory location 112 may be a block 114 including multiple cells 116. The cells 116 may be single-level cells, multi-level cells, triple-level cells, quad-level cells, and/or penta-level cells, for example. Other examples of memory locations 112 are possible; for instance, each memory location may be a die containing multiple blocks. Moreover, each memory location may include one or more blocks in a 3-D NAND array. Moreover, the illustrated memory locations 112 may be logical blocks which are mapped to one or more physical blocks.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
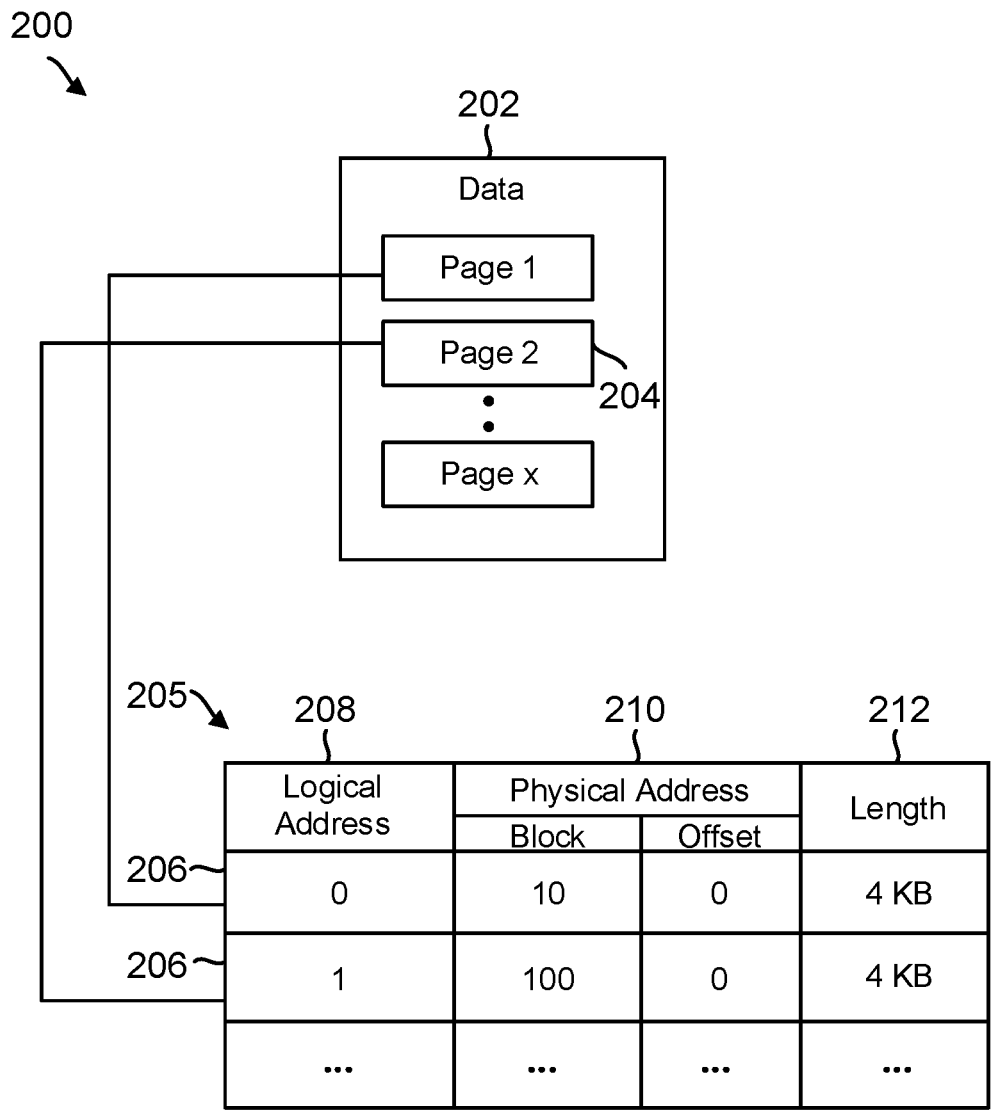
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
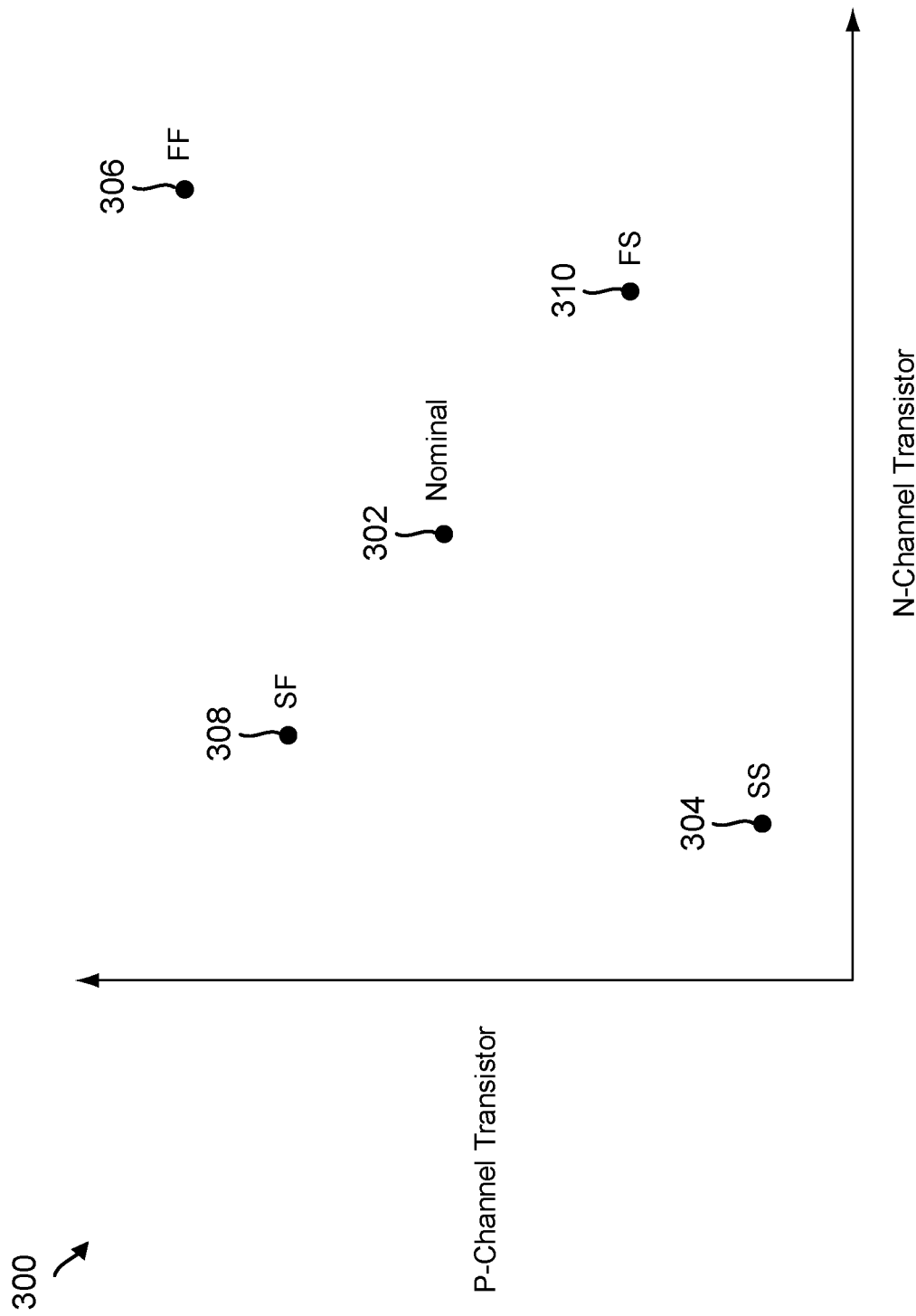
FIG. 3 is a diagram illustrating a graphical representation of process corners for complementary metal-oxide-semiconductor (CMOS) chips manufactured on a single wafer including the storage device of FIG. 1.

FIG. 3 is a two-dimensional graph that is typically used to show the distribution of chip (e.g. die) parameters for CMOS technology. Statistically, most of the CMOS chips will have electrical parameters that meet nominal specifications. These CMOS chips may be plotted around the center 302 of the graph. A number of CMOS chips, however, will deviate from the nominal case towards the process corners. Referring to FIG. 3, each process corner is represented by a two-letter designation. The first letter refers to the NMOS transistors and the second letter refers to the PMOS transistors, and each letter has either an F designation for fast or an S designation for slow. Thus, CMOS chips with both types of transistors being slow or fast will be plotted around the slow corner (SS) 304 or fast corner (FF) 306, respectively. There may also be CMOS chips that are plotted around cross corners where one type of transistor is faster and the other type of transistor is slower. By way of example, CMOS chips with slow NMOS transistors and fast PMOS transistors may be plotted around the slow-fast (SF) corner 308. CMOS chips with fast NMOS transistors and slow PMOS transistors may be plotted around the fast-slow (FS) corner 310. Preferably, all the CMOS chips manufactured on a semiconductor wafer can be plotted within the boundaries spanning the process corners. The performance of the CMOS chips that reside outside these boundaries cannot be guaranteed to operate properly under worst case conditions.

Figure 4:
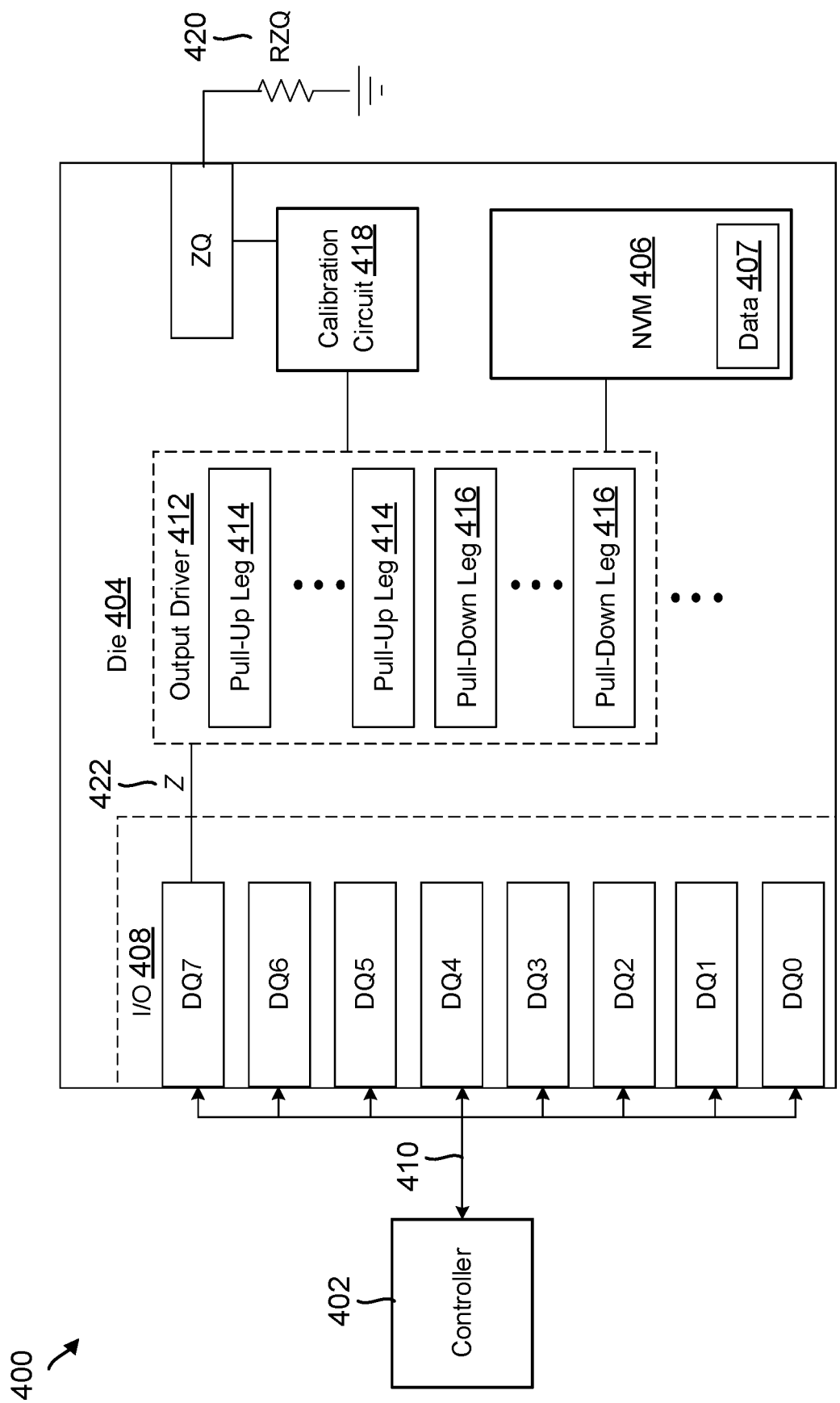
FIG. 4 is a conceptual diagram illustrating an example of a die including a calibration circuit and an output driver for communicating data to a controller in the storage device of FIG. 1.

FIG. 4 illustrates an example diagram 400 illustrating a controller 402 in communication with a die 404 over a bus. Die 404 may include a NVM 406 that stores data 407 (e.g. data 119 of FIG. 1). The controller 402 may correspond to controller 123 of FIG. 1, and the NVM 406 of die 404 may correspond to the memory location 112 of FIG. 1. Each die may include various pins which serve as interfaces between the controller and the die. For example, the die may include an input/output (I/O) 408 which is configured to receive inputs and transmit outputs (e.g. input data and commands from the controller to read, write, or erase data, and output data from the NVM 406). I/O 408 may include a number of data lines or pins (DQ) that receive individual bits of input data and send individual bits of output data over a bus 410. In the example of FIG. 4, the bus 410 may be an 8-bit bus which interfaces with eight DQ pins (DQ7:0), although a different bus width and number of DQs may be used (e.g. a 16-bit bus with 16 DQs). For clarity, only I/O 408 is illustrated in FIG. 4 for die 404; however die 404 may include other pins. For instance, the die may include a CE for receiving a chip-enable signal from the controller, a ready/busy (R/B) for outputting a ready or busy status to the controller, an address latch enable (ALE) for latching addresses into NAND, a command latch enable (CLE) for latching commands into a command register, a RE (read enable) for enabling output data buffers, a WE (write enable) for clocking data, addresses, or commands into the NAND, and a bidirectional data strobe signal (DQS) that clocks the I/O 408 to receive and transmit data over the bus 410. Moreover, while FIG. 4 illustrates a single die in communication with the controller 402, it should be understood that multiple dies may communicate with the controller over the bus 410.

The die 404 may include an output driver 412 for each DQ pin. For clarity, only one output driver 412 is illustrated for DQ7, although separate output drivers may be connected to the other DQs. Each output driver 412 may be a CMOS driver that includes pull-up legs 414 (p-type metal-oxide-semiconductor (PMOS) transistors) for pulling up the voltage of the data output on the DQ line to a logic 1 and pull-down legs 416 (n-type metal-oxide-semiconductor (NMOS) transistors) for pulling down the voltage of the data output on the DQ line to a logic 0. The die 404 may also include a calibration circuit 418 connected via a ZQ pin to a calibration resistor 420 (RZQ) which is external to the die 404. The calibration circuit 418 may calibrate an output impedance 422 of each output driver 412 based on the resistance of the calibration resistor 420.

Figure 5:
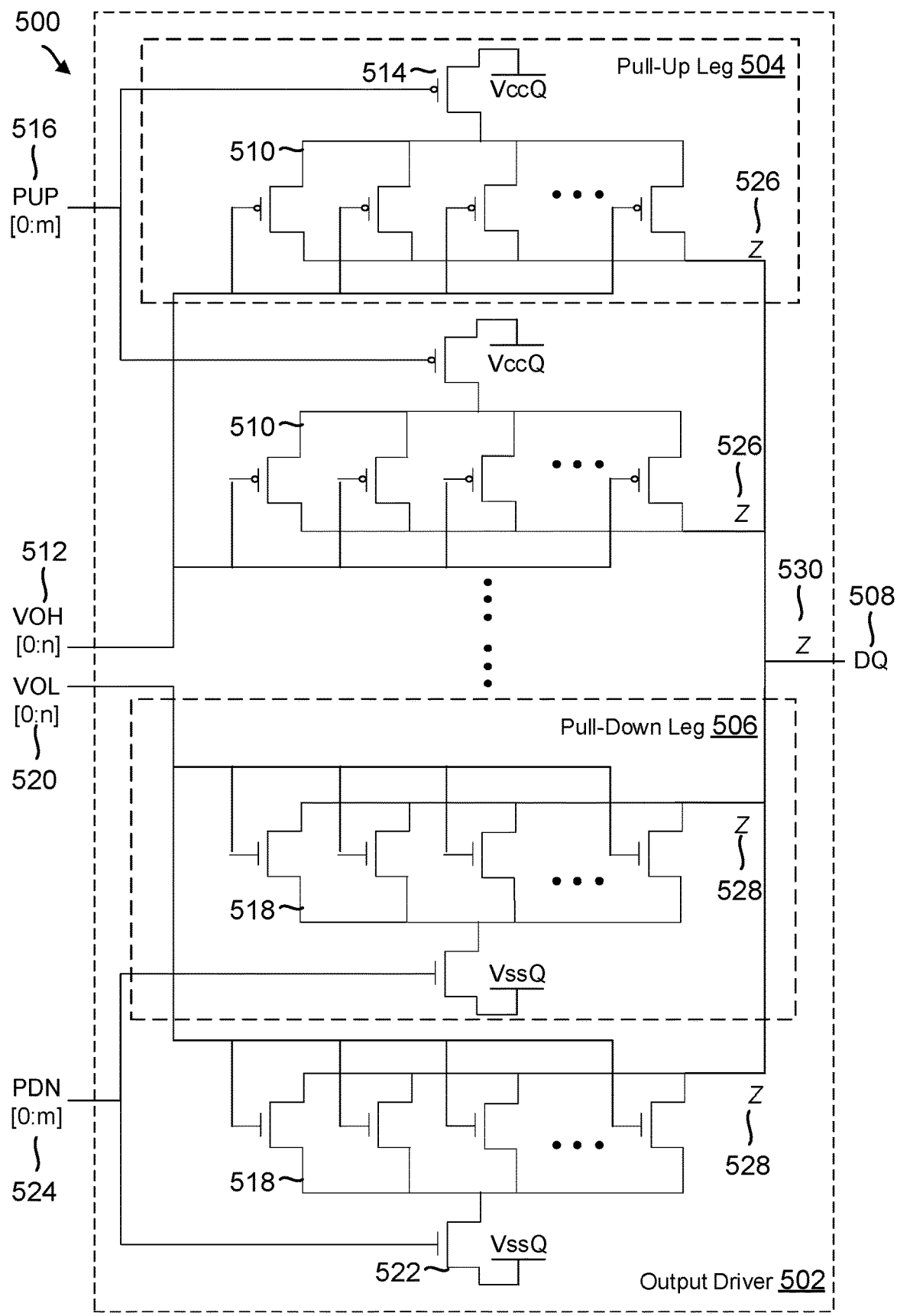
FIG. 5 is a conceptual diagram illustrating an example of the output driver depicted in the die of FIG. 4.

FIG. 5 illustrates an example of an output driver 502 (a CMOS driver) including pull-up legs 504 (PMOS) and pull-down legs 506 (NMOS) for one of the DQ pins (DQ 508). Output driver 502 may correspond to output driver 412 of FIG. 4, pull-up legs 504 and pull-down legs 506 may respectively correspond to pull-up legs 414 and pull-down legs 416 of FIG. 4, and DQ 508 may correspond to one of the DQs in I/O 408 of FIG. 4. While FIG. 5 illustrates a specific example of a circuit for the output driver 502, the output driver 502 is not so limited and may have other transistor arrangements, inputs/outputs, etc.

In the example of FIG. 5, each pull-up leg 504 may include a plurality of parallel transistors 510 (PMOS transistors) each having a gate connected to an output high voltage (VOH 512) and a drain connected to the DQ 508. The source of each of the parallel transistors 510 may be connected to an enabling pull-up transistor 514, which may allow the I/O power supply voltage VccQ (e.g. 1.2 V for DDR3) to pass to the source of each of the parallel transistors 510 in response to a pull-up enable signal (PUP 516) at the gate of the enabling pull-up transistor 514. Similarly, each pull-down leg 506 may include a plurality of parallel transistors 518 (NMOS transistors) each having a gate connected to an output low voltage (VOL 520) and a source connected to the DQ 508. The drain of each of the parallel transistors 518 may be connected to an enabling pull-down transistor 522, which may allow the ground voltage supply VssQ (e.g. 0 V) to pass to the drain of each of the parallel transistors 518 in response to a pull-down enable signal (PDN 524) at the gate of the enabling pull-down transistor 522.

Each pull-up leg 504 has an output impedance 526 which is controlled based on the VOH 512. Similarly, each pull-down leg 506 has an output impedance 528 which is controlled based on the VOL 520. VOH[0:n] and VOL[0:n] respectively represent bitmaps corresponding to a combination of high/low voltages applied to the gates of the parallel transistors in the pull-up legs 504 and pull-down legs 506, where n is the number of parallel transistors in each leg. For instance, where n=4 (corresponding to four transistors in each pull-up/pull-down leg), a configuration for VOH of 1010 indicates a high voltage is applied only to the first and third transistors of each pull-up leg (i.e. only the first and third PMOS transistors are activated), while a low voltage is applied to the other transistors of each pull-up leg. Similarly, a configuration for VOL of 0101 indicates a low voltage is applied only to the first and third transistor of each pull-down leg (i.e. only the first and third NMOS transistors are activated), while a high voltage is applied to the other transistors of each pull-down leg. The output impedances 526, 528 may thus be controlled based on the activated transistors in each leg. For instance, each parallel transistor in a single leg may be configured to have a different impedance (e.g. 20 ohms, 40 ohms, 80 ohms, etc.), and thus the output impedance of each leg (i.e. the combined impedance of the parallel transistors) may be configurable based on the selected transistors activated by VOH 512 and VOL 520. As an example, if only a 500 ohm and 750 ohm transistor are activated in each pull-up/pull-down leg by VOH and VOL, the output impedances 526, 528 of each leg may be 300 ohms.

The output driver 502 may also have an output impedance 530 which is controlled based on the output impedances 526, 528 and the PUP 516 and PDN 524, respectively. Output impedance 530 may correspond to output impedance 422 of the output driver 412 of FIG. 4. PUP[0:m] and PDN [0:m] respectively represent bitmaps corresponding to a combination of high/low voltages applied to the gates of the enabling pull-up transistor 514 for each pull-up leg 504 and enabling pull-down transistor 522 for each pull-down leg 506, where m is the number of parallel pull-up legs and parallel pull-down legs in the output driver. For instance, where m=6 (corresponding to six pull-up legs 504 and six pull-down legs 506 in each output driver 502), a configuration for PUP of 001111 indicates a low voltage is applied only to the first and second enabling pull-up transistors (i.e. only the first and second pull-up legs are activated), while a high voltage is applied to the other enabling pull-up transistors in the other legs. Similarly, a configuration for PDN of 110000 indicates a high voltage is applied only to the first and second enabling pull-down transistors (i.e. only the first and second pull-down legs are activated), while a low voltage is applied to the other enabling pull-down transistors in the other legs. The output impedance 530 may thus be controlled not only based on the output impedances 526, 528 from VOH and VOL, but also based on the PUP and PDN. For instance, if the output impedances 526, 528 are each configured to be 300 ohms based on VOH and VOL as described above, then if six of the parallel pull-up legs are activated by PUP and six of the parallel pull-down legs are activated by PDN, the output impedance 530 of the output driver 502 may be 25 ohms.

Figure 6:
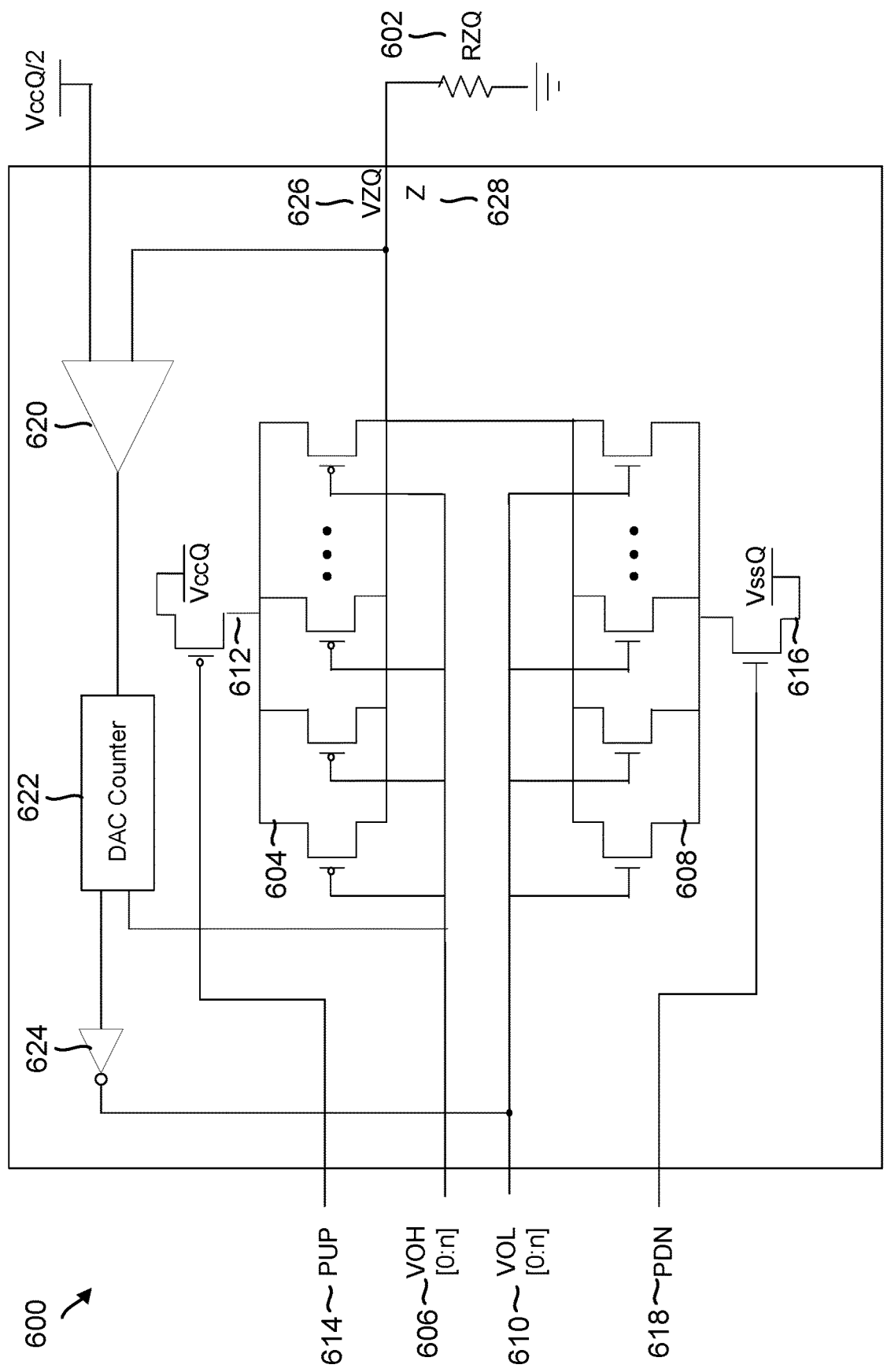
FIG. 6 is a conceptual diagram illustrating an example of the calibration circuit depicted in the die of FIG. 4.

FIG. 6 illustrates an example of a calibration circuit 600 which may calibrate the output impedance 422, 530 of the output driver 412, 502 based on a calibration resistor 602 (RZQ) connected to a ground. Calibration circuit 600 may correspond to calibration circuit 418 in FIG. 4, and calibration resistor 602 may correspond to calibration resistor 420 in FIG. 4. The calibration circuit 600 may include a CMOS device including a plurality of parallel pull-up transistors 604 (PMOS transistors) each having a gate connected to an output high voltage (VOH 606) and a drain connected to the calibration resistor 602 (e.g. via a ZQ pin); a plurality of parallel pull-down transistors 608 (NMOS transistors) each having a gate connected to an output low voltage (VOL 610) and a drain connected to the drain of the pull-up transistors; an enabling pull-up transistor 612 having a source connected to the I/O power supply voltage VccQ (e.g. 1.2 V for DDR3), a gate connected to a pull-up enable signal (PUP 614), and a drain connected to the source of the pull-up transistors; and an enabling pull-down transistor 616 having a source connected to a ground voltage supply VssQ (e.g. 0 V), a gate connected to a pull-down enable signal (PDN 618), and a drain connected to the source of the pull-down transistors. Thus, the CMOS device in the calibration circuit 600 may mirror the CMOS device in the output driver 502 (i.e. with respect to one of the pull-up legs 504 and pull-down legs 506). For instance, each of the parallel pull-up transistors and parallel-pull down transistors may have different impedances (e.g. 20 ohm, 40 ohm, 80 ohm, etc.) that match the corresponding impedances of the transistors in the pull-up legs 504 and pull-down legs 506. Similarly, VOH 606 may connect to VOH 512 in FIG. 5, VOL 610 may connect to VOL 520 in FIG. 5, PUP 614 may connect to PUP 516 in FIG. 5, and PDN 618 may connect to PDN 524 in FIG. 5.

The calibration circuit 600 may also include a comparator 620 and a digital-to-analog converter (DAC) counter 622. The comparator 620 may include an input connected to half of the I/O power supply voltage (i.e. VccQ/2), and another input connected to the calibration resistor 602. The DAC counter 622 may include an input connected to an output of the comparator 620, and an output connected to the VOH 606. The output of the DAC counter 622 may also be connected to the VOL 610, e.g. via an inverter 624. The output of the DAC counter 622 may be n bits, where n is equal to the number of parallel pull-up transistors 604 and parallel pull-down transistors 608. For instance, if n=4 (the pull-up transistors and pull-down transistors each include 4 parallel transistors), the output of the DAC counter may include 4 bits, with each bit representing whether a high voltage (logic 1) or a low voltage (logic 0) is to be applied to the gate of each transistor. Thus, the output of the DAC counter may correspond to the bitmaps represented by VOH[0:n] and VOL[0:n].

The output of the DAC counter may change (and thus the voltages applied to the gates of the parallel pull-up and pull-down transistors may change) in response to the output of the comparator 620. That is, the DAC counter may be connected to the comparator 620 such that, when the output of the comparator 620 indicates that the voltage at ZQ (VZQ 626) is not equal to VccQ/2, the DAC counter 622 increments. As the incrementing of the DAC counter changes the transistors which are activated and thus the output impedance 628 of the calibration circuit, the VZQ 626 may correspondingly change, in response to which the DAC counter 622 may again increment if VZQ 626 is still not equal to VccQ/2. The comparator 620 may thus continue to compare the changing VZQ 626 at different DAC counter outputs until VZQ 626 becomes at least equal to VccQ/2, at which point the output impedance 628 matches the impedance or resistance of the calibration resistor 602. The current DAC counter output may then be carried over to the output driver 412, 502 as the corresponding VOH[0:n] (VOH 512), which calibrates the output impedances 526 of the PMOS transistors to similarly match the impedance of the calibration resistor 602. Additionally, an inversion of the current DAC counter output (using inverter 624) may similarly be carried over to the output driver as the corresponding VOL[0:n] (VOL 520), which calibrates the output impedances 528 of the NMOS transistors to similarly match the impedance of the calibration resistor 602.

The controller 123 may calibrate the output impedance 422, 530 of the output driver 412, 502 using the calibration circuit 418, 600 by sending a calibration command (e.g. a ZQ calibration command) to the die 404. In one example of the calibration process, in response to the calibration command, the PUP 614 may be signaled to activate the enabling pull-up transistor 612, which allows VccQ to pass to the source of the parallel pull-up transistors 604. At this stage, the DAC counter 622 may be reset to 0001 (assuming n=4), and the resulting VZQ 626 may be compared against VccQ/2. If the voltages do not match, the DAC counter 622 is incremented until the VZQ 626 matches VccQ/2. When the voltages match, the output impedance 628 correspondingly matches the impedance of calibration resistor 602, and the voltages corresponding to the DAC counter output (VOH 606) are carried over to the pull-up legs 414, 504 of the output driver 412, 502 to be similarly calibrated. For instance, if RZQ is 300 ohms and the first and third transistors of are 500 ohm and 750 ohm, respectively, the output impedance 628 may be 300 ohms in response to a DAC counter of 1010, and thus a VOH of 1010 may be applied to the pull-up legs to calibrate each leg to an output impedance 526 of 300 ohms as described above. Afterwards, the PDN 618 may be signaled to activate the enabling pull-down transistor 616, which allows VssQ to pass to the drain of the parallel pull-down transistors 608. At this stage, the previous DAC counter output (e.g. 1010) may be inverted and carried over to the pull-down legs 416, 506 of the output driver to be similarly calibrated. For instance, a VOL of 0101 may be applied to the pull-down legs to similarly calibrate each leg to an output impedance 528 of 300 ohms. Finally, the PUP 516 and PDN 524 may further reduce the total output impedance based on the number of pull-up legs and pull-down legs which are enabled, to result in an output impedance 422, 530 of, e.g. 25 ohms, as described above.

Thus, in the above example, the calibration circuit 418, 600 may be designed to first calibrate the pull-up legs 504 based on the calibration resistor 602, after which the pull-down legs 506 are calibrated based on the pull-up leg calibration. However, while FIG. 6 illustrates a specific example of the calibration circuit 418, 600 as described, the calibration circuit 600 is not so limited and may have other transistor arrangements, inputs/outputs, components, etc. for calibrating the output impedance 422, 530 of the output driver 412, 502. Moreover, the calibration circuit may be alternatively designed to first calibrate the pull-down legs based on the calibration resistor (e.g. by connecting the calibration resistor 602 to VccQ instead of ground and by activating PDN 618 prior to PUP 614), after which the pull-up legs 504 may be calibrated based on the pull-down leg calibration.

Accordingly, the output impedance 422, 530 of the output driver 412, 502 may be calibrated using the calibration circuit 418, 600 based on the pre-configured calibration resistor. The calibration circuit may calibrate the impedance to a minimum output impedance that enables the controller 123, 402 to read data 119, 407 stored in the NVM 110, 406 across PVT variations of the die 404 at a maximum loading of the controller. For example, the number and individual impedances of the pull-up and pull-down transistors in the CMOS devices for both the output driver and the calibration circuit may be designed such that, when eight dies share the bus 410 with the controller 402, the output impedance 422, 530 may be calibrated to a minimum of 25 ohms using a 300 ohm calibration resistor as described above. The calibration may be successfully performed notwithstanding whether the die 404 operates at a nominal corner 302, a SS corner 304, FF corner 306, SF corner 308, or FS corner 310, notwithstanding whether the die 404 operates at a nominal voltage (e.g. 1.2 VccQ), a minimum voltage (e.g. 1.14 VccQ), or a maximum voltage (e.g. 1.26 VccQ), and notwithstanding whether the die operates at a nominal temperature (e.g. 25° C.), a minimum temperature (e.g. −40° C.), or a maximum temperature (e.g. 85° C.). However, the minimum output impedance may limit the maximum loading to the controller. For example, if 25 ohms is the minimum output impedance that may be calibrated across PVT variations based on a 300 ohm calibration resistor, the output driver strength may be insufficient to enable the controller to read data from more than eight dies (or another maximum number) sharing the same bus 410.

Figure 7A:
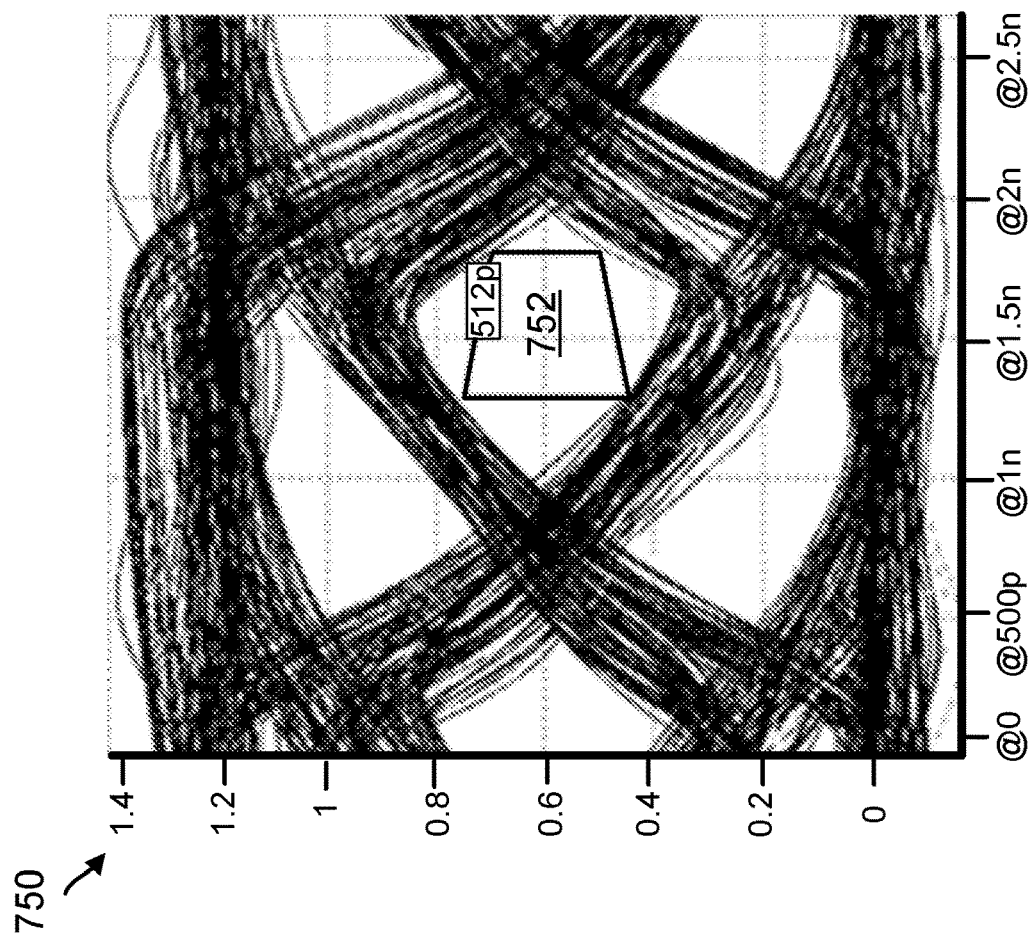
FIGS. 7A and 7B are diagrams illustrating examples of DQ timing charts showing superimposed output patterns in the storage device of FIG. 1.

Moreover, the minimum output impedance may limit the data output speed. FIG. 7A illustrates an example timing chart 700 depicting superimposed data output voltages on the DQs for different bit patterns (e.g. repeating logic 1's, repeating logic 0's, and alternating logic 1's and 0's) at a data output speed of 650 MT/s and an output driver impedance of 25 ohms. A data valid window 702 is located within a data eye of the bit patterns, which represents a time during which the voltages of the data outputs are valid and may be correctly read by the controller. Data may be correctly read when the data valid window 702 exceeds a minimum threshold (e.g. 300 ps or another number). However, the minimum output impedance may limit the length of the data valid window 702. For example, when the minimum output impedance of the output drivers for the DQs is 25 ohms and the speed is 650 MT/s, the data valid window 702 may span 339 ps (or another number), which provides minimal timing margin (e.g. 39 ps) over the threshold. This small timing margin limits the data output speed, since the data valid window may shrink at higher speeds. For example, if the data output speed is increased from 650 MT/s, the data valid window 702 may shrink below 300 ps (in this example), possibly resulting in more bit errors and reduced storage device performance.

To provide for more die loading and higher data output speeds, the calibration resistor 602 may be selected to have a resistance that enables the calibration circuit 418, 600 to calibrate the output impedance 422, 530 to a lower impedance than the minimum output impedance described above. For example, a 240 ohm resistor (or another resistance smaller than 300 ohms) may be selected as calibration resistor 420, 602. When the controller 123, 402 sends a calibration command to the die 404, as discussed above, the calibration circuit may calibrate the output impedance 628 to match the impedance of the calibration resistor (e.g. 240 ohms), the corresponding VOH 512, 606 and VOL 524, 610 may calibrate the pull-up legs 504 and pull-down legs 506 respectively to match the output impedance 628 (e.g. 240 ohms), and the PUP 516 and PDN 524 signals may selectively enable the pull-up legs 504 and pull-down legs 506 to result in the reduced, output impedance 530 for the driver (e.g. 20 ohms). By reducing the output impedance, a larger load to the controller (i.e. additional dies) may be added to the storage device, and higher output speeds may be achieved.

Figure 7B:
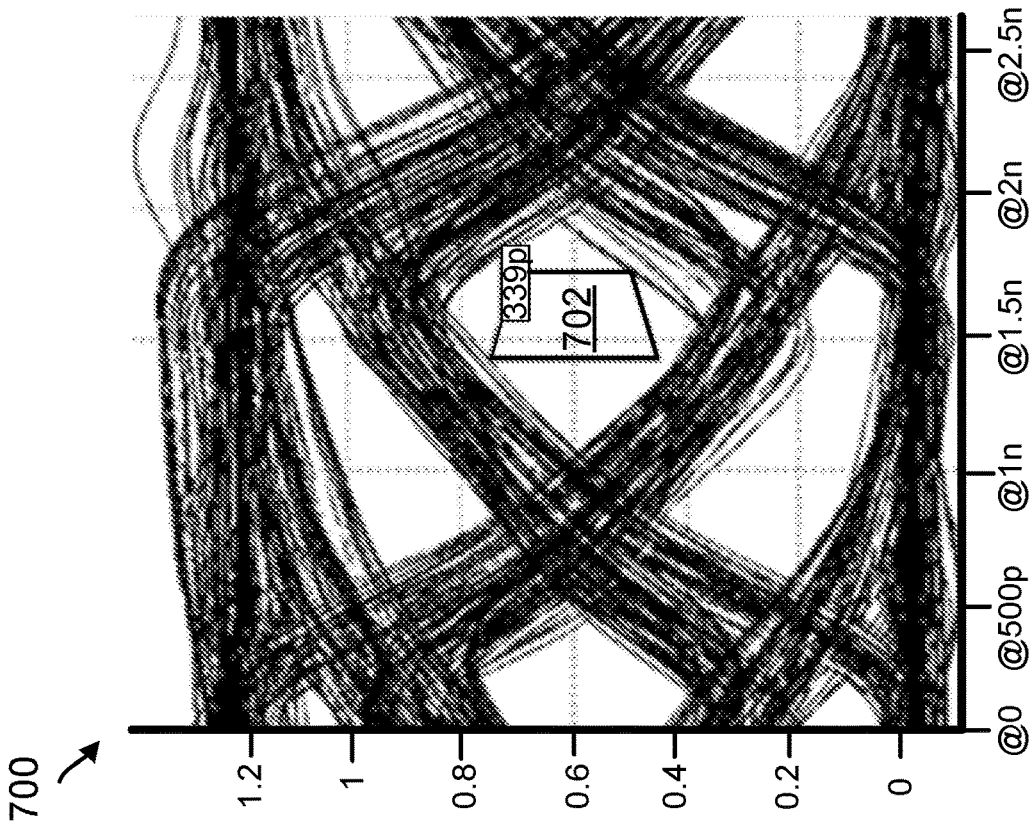

For example, FIG. 7B illustrates an example timing chart 750 depicting superimposed data output voltages on the DQs for different bit patterns at a data output speed of 650 MT/s, similar to FIG. 7A, but with a lower output driver impedance of 20 ohms based on the modified RZQ. As can be seen in FIG. 7B, the data valid window 752 located within the data eye of the bit patterns may be wider than the data valid window 702 due to the lower output impedance, in this example spanning 512 ps (or another larger number). As a result, a larger timing margin (e.g. 212 ps) over the minimum threshold (e.g. 300 ps) may be provided in the example of FIG. 7B than in the example of FIG. 7A, allowing for greater data output speeds.

However, even when the calibration resistor 420, 602 is reduced in resistance, the output impedance of the output driver 412, 502 may still in some cases not be able to be calibrated to the lower impedance (e.g. 20 ohms) across PVT variations. For example, although the number and individual impedances of the pull-up legs and pull-down legs in the CMOS drivers may be sufficient for calibration based on a 240 ohm resistor to an output impedance of 20 ohms for typical and fast corners (e.g. nominal 302 and FF 306), the number and impedances of the legs may be insufficient for calibration to the lower output impedance when the die 404 is a slow corner (e.g. SS 304). Similarly, the CMOS drivers may be sufficient for calibration to the lower impedance at nominal voltages and temperatures, but not at minimal voltages and maximum temperatures. For instance, a slow corner may have required all the transistors in the pull-up legs and pull-down legs to be activated to reduce the output impedance to 25 ohms for a 300 ohm resistor, and thus there may not be any more transistors to activate to further reduce the output impedance to 20 ohms. Therefore, a screening process may be implemented to screen out dies (or other chips) which are unable to calibrate the output impedance to the lower impedance based on the modified RZQ. Different examples of screening processes are described below with respect to FIGS. 8 and 9.

Figure 8:
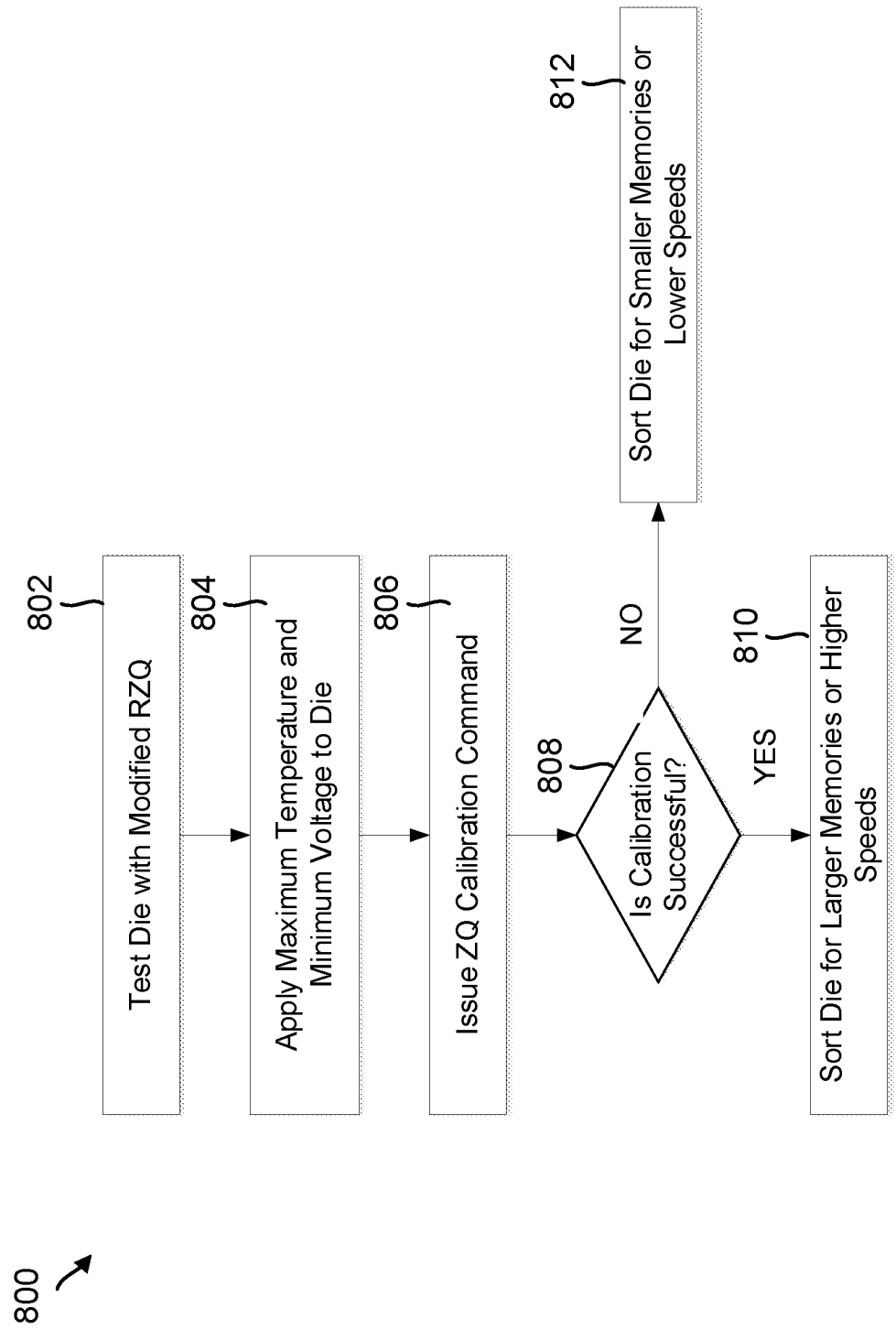
FIG. 8 is a flow chart illustrating a method for testing and binning a die with a modified calibration resistor in the storage device of FIG. 1.

FIG. 8 illustrates an example flow chart 800 of a method for screening dies in a storage device 102 such as the one illustrated in FIG. 1. For example, the method can be carried out using a storage device 102 such as the one illustrated in FIG. 1. One or more steps in the flow chart can be controlled using the controller as described below (e.g. controller 123, 402), or by some other suitable means. The controller may be external to the die.

As represented by block 802, a die including a NAND flash memory, DRAM, or other IC may be tested using a modified calibration resistor. For instance, referring to FIGS. 4-6, a manufacturer of die 404 may test ZQ calibration of the die using a calibration resistor 420, 602 that has a resistance lower than that which may produce a minimum output impedance of the output driver 412, 502 across PVT variations as discussed above (e.g. 240 ohms instead of 300 ohms for NAND).

As represented by block 804, a maximum temperature and minimum voltage may be applied to the die. For instance, referring to FIGS. 4-6, VccQ may be reduced to a minimum voltage (e.g. 1.14 V for DDR3), and heat may be applied to the transistors in the die 404 to increase the temperature to a maximum operating temperature (e.g. 85° C.). This step allows the die to be tested at the slowest corner boundary of PVT.

As represented by block 806, a ZQ calibration command may be issued to the die. For instance, referring to FIGS. 4-6, the controller 123, 402 may issue a calibration command to the calibration circuit 418, 600 to calibrate the output impedance 422, 530 of each output driver 412, 502 based on the modified calibration resistor. If calibration is successful (e.g. the output impedance 628 was matched to the modified calibration resistor and the output impedance 422, 530 was subsequently calibrated to the lower output impedance based on PUP/PDN), a calibration status register in the die (e.g. ZQ_cal_status) may be updated to indicate calibration was successful; otherwise the register may be updated to indicate calibration has failed.

As represented by block 808, the controller 123 may check the calibration status register to determine whether calibration is successful, and if calibration was successful, then as represented by block 810, the die may be sorted or binned for products with larger memories or higher speeds. Alternatively, if calibration was unsuccessful, then as represented by block 812, the die may be sorted or binned for products with smaller memories or lower speeds. For example, referring to FIGS. 4-6, if calibration of die 404 is determined to be successful (e.g. the output impedance 628 was matched to the impedance of the modified calibration resistor such as 240 ohms and the output impedance 422, 530 was subsequently calibrated to the lower output impedance based on PUP/PDN such as 20 ohms), then the die 404 may be implemented in a storage device 102 with more die stacks (e.g. 16 dies instead of 8 dies, or some other larger number), or with greater speeds (e.g. as described above with respect to FIG. 7B). Otherwise, if calibration of die 404 is determined to be unsuccessful (e.g. the output impedance 628 was not matched to the impedance of the modified calibration resistor such as 240 ohms, or the output impedance 422, 530 was not able to be calibrated to the lower output impedance based on PUP/PDN such as 20 ohms), then the die 404 may be implemented in a storage device 102 with less die stacks (e.g. 8 dies or some other smaller number) or with lesser speeds.

Figure 9:
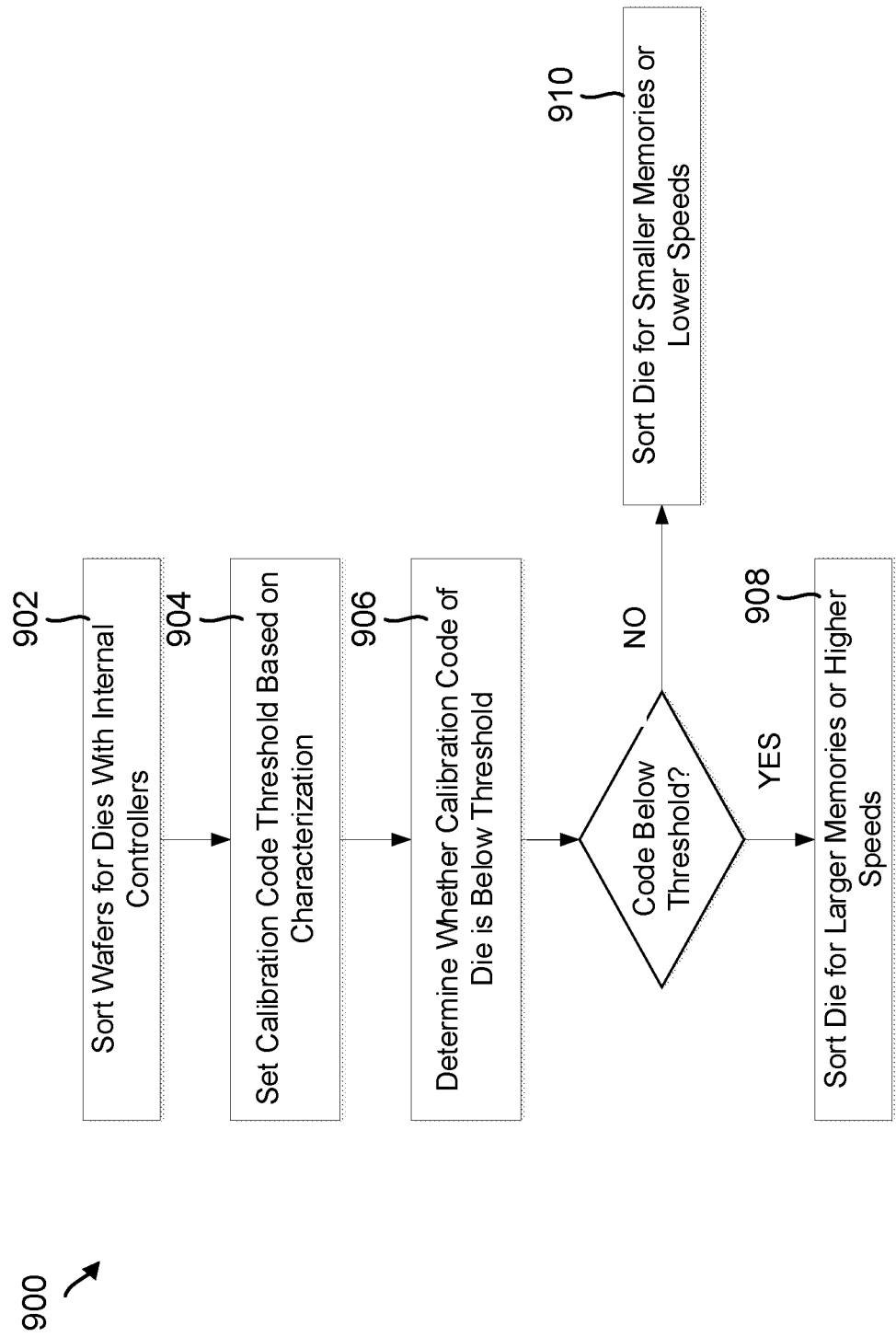
FIG. 9 is a flow chart illustrating another method for testing and binning a die with a modified calibration resistor in the storage device of FIG. 1.

FIG. 9 illustrates an example flow chart 900 of another method for screening dies in a storage device 102 such as the one illustrated in FIG. 1. For example, the method can be carried out using a storage device 102 such as the one illustrated in FIG. 1. One or more steps in the flow chart can be controlled using the controller as described below (e.g. controller 123, 402), or by some other suitable means. The controller may be internal to the die.

As represented by block 902, a wafer may be sorted for dies with internal controllers. For instance, referring to FIG. 4, although that Figure illustrates controller 402 as external to die 404, the controller 402 may alternatively be internal to die 404. A manufacturer of the die 404 may sort wafers including multiple dies to identify wafers that include such dies having internal controllers for calibration testing.

As represented by block 904, a calibration code threshold may be set based on a characterization process. For instance, referring to FIGS. 4-6, when the calibration circuit 418, 600 generates outputs from the DAC counter 622, each output may constitute a calibration code. For example, an output of 1010 from DAC counter 622 may constitute one calibration code (corresponding to activation of first and third PMOS transistors in the pull-up leg of the calibration circuit, as well as activation of first and third NMOS transistors in the pull-down leg of the calibration circuit after inversion by inverter 624). When characterization is performed for the different dies on the wafer with internal controllers, the calibration of each die 404 based on the modified calibration resistor may be tested across different voltage and temperatures. During the characterization process, different calibration codes resulting in successful calibration may be generated at different temperatures and voltages. The highest calibration code that results in successful calibration even at minimum voltage and maximum temperature may be set as the calibration code threshold.

As represented by block 906, the controller determines whether the calibration code of the die is below the calibration code threshold. For instance, referring to FIGS. 4-6, the controller 123, 402 may issue a calibration command to the calibration circuit 418, 600 to calibrate the output impedance 422, 530 of each output driver 412, 502 based on the modified calibration resistor. The calibration code which is generated to calibrate the output impedance in response to the command may be stored in a calibration code register (e.g. ZQ_cal) accessible by internal controllers. The controller may thus access the calibration code from the register of the die 404, and determine whether the calibration code is below the threshold or not accordingly.

If the code is determined to be below the calibration code threshold, then as represented by block 908, the die may be sorted or binned for products with larger memories or higher speeds. Alternatively, if the code is not determined to be below the calibration code threshold, then as represented by block 910, the die may be sorted or binned for products with smaller memories or lower speeds. For example, referring to FIGS. 4-6 and assuming a calibration code threshold of 1100, if the output impedance 628 was matched to the impedance of the modified calibration resistor such as 240 ohms using a generated calibration code of 1011 or lower, the die 404 may be implemented in a storage device 102 with more die stacks (e.g. 16 dies instead of 8 dies, or some other larger number), or with greater speeds (e.g. as described above with respect to FIG. 7B). However, if the output impedance 628 was matched to the impedance of the modified calibration resistor such as 240 ohms using a generated calibration code of 1100 or higher, then the die 404 may be implemented in a storage device 102 with less die stacks (e.g. 8 dies or some other smaller number) or with lesser speeds.

FIG. 10 illustrates an example flow chart 1000 of a method for calibrating an output impedance of an output driver. For example, the method can be carried out in a storage device 102 such as the one illustrated in FIG. 1. Each of the steps in the flow chart can be controlled using the controller as described below (e.g. controller 123, 402), or by some other suitable means.

As represented by block 1002, the controller commands a calibration circuit to calibrate an output impedance of an output driver. The output driver is configured to output stored data. The calibration circuit is configured to calibrate the output impedance of the output driver using a calibration resistor. For instance, referring to FIGS. 4-6, the controller 123, 402 may command a calibration circuit 418, 600 to calibrate an output impedance 422, 530 of an output driver 412, 502. The output driver may output stored data (e.g. data 119, 407). The calibration circuit may calibrate the output impedance 422, 530 of the output driver using a calibration resistor 420, 602.

The calibration resistor has a resistance that enables the calibration circuit to calibrate the output impedance to a lower impedance than a minimum impedance required by a controller to read the stored data across process, voltage and temperature variations of the die at maximum loading of the controller. For example, referring to FIGS. 4-6, the calibration resistor 602 may have a resistance that enables the calibration circuit 418, 600 to calibrate the output impedance 422, 530 to a lower impedance than a minimum output impedance required by the controller 123, 402 to read the stored data (data 119, 407) across PVT variations of the die 404 at a maximum loading of the controller (e.g. 8 dies). For example, a 240 ohm resistor may be selected as calibration resistor 420, 602 in lieu of a 300 ohm resistor for NAND, which may allow the output impedance 530 of the driver to be reduced to a lower impedance of 20 ohms than the minimum output impedance of the output driver across PVT variations (e.g. 25 ohms). The minimum output impedance described above may enable the controller 123, 402 to read data 119, 407 stored in the NVM 110, 406 across PVT variations of the die 404 at a maximum loading of the controller. For example, the number and individual impedances of the pull-up and pull-down transistors in the CMOS devices for both the output driver and the calibration circuit may be designed such that, when eight dies share the bus 410 with the controller 402, the output impedance 422, 530 may be calibrated to a minimum of 25 ohms using a 300 ohm calibration resistor notwithstanding whether the die 404 operates at a nominal corner 302, a SS corner 304, FF corner 306, SF corner 308, or FS corner 310, notwithstanding whether the die 404 operates at a nominal voltage (e.g. 1.2 VccQ), a minimum voltage (e.g. 1.14 VccQ), or a maximum voltage (e.g. 1.26 VccQ), and notwithstanding whether the die operates at a nominal temperature (e.g. 25° C.), a minimum temperature (e.g. −40° C.), or a maximum temperature (e.g. 85° C.). In contrast, the lower output impedance (e.g. 20 ohms) may not operate across PVT variations. For example, although the number and individual impedances of the pull-up legs and pull-down legs in the CMOS drivers may be sufficient for calibration based on a 240 ohm resistor to an output impedance of 20 ohms for typical and fast corners (e.g. nominal 302 and FF 306), the number and impedances of the legs may be insufficient for calibration to the lower output impedance when the die 404 is a slow corner (e.g. SS 304).

The output driver further comprises a plurality of parallel pull-up driver transistors and a plurality of parallel pull-down driver transistors. The calibration circuit may be configured to set an impedance of the parallel pull-up drive transistors and an impedance of the parallel pull-down driver transistors to the resistance of the calibration resistor. For instance, referring to FIGS. 4-6, the output driver 412, 502 may include a plurality of parallel pull-up driver transistors 510 in one pull-up leg 504 and a plurality of parallel pull-down driver transistors 518 in one pull-down leg 506. The calibration circuit 418, 600 may set an impedance of the parallel pull-up driver transistors 510 and parallel pull-down driver transistors 518 (e.g. output impedance 526, 528, respectively) to the resistance of the calibration resistor 420, 602.

The output driver may further comprise a plurality of parallel second pull-up driver transistors coupled in parallel with the pull-up driver transistors and a plurality of parallel second pull-down driver transistors coupled in parallel with the pull-down driver transistors. The calibration circuit may be further configured to set an impedance of the parallel second pull-up drive transistor and an impedance of the parallel second pull-down driver transistor to the resistance of the calibration resistor. For instance, referring to FIGS. 4-6, the output driver 412, 502 may include a plurality of parallel second pull-up driver transistors 510 in different pull-up legs 504 and a plurality of parallel pull-down driver transistors 518 in different pull-down legs 506, where each pull-up leg and pull-down leg are coupled in parallel with each other. The calibration circuit 418, 600 may set an impedance of the parallel pull-up driver transistors 510 and parallel pull-down driver transistors 518 in the multiple pull-up legs and pull-down legs (e.g. output impedance 526, 528, respectively) to the resistance of the calibration resistor 420, 602.

The output driver may further comprise a plurality of parallel pull-up driver transistors and a plurality of parallel pull-down driver transistors. The calibration circuit may be further configured to control the output impedance of the output driver by controlling the pull-up driver transistors and the pull-down driver transistors. For instance, referring to FIGS. 4-6, the output driver 412, 502 may include a plurality of parallel pull-up driver transistors 510 and a plurality of parallel pull-down transistors 518. The calibration circuit 418, 600 may control the output impedance 422, 530 of the output driver 412, 502 by controlling the pull-up driver transistors 510 and pull-down driver transistors 518 (e.g. using VOH 512 and VOL 520, respectively, as well as PUP 516 and PDN 524, respectively).

The calibration circuit may comprise a plurality of parallel pull-up calibration transistors. The calibration circuit may be further configured to control the pull-up calibration transistors based on the calibration resistor and control the pull-up drivers based on the control of the pull-up calibration transistors. For instance, referring to FIGS. 4-6, the calibration circuit 418, 600 may include a plurality of pull-up calibration transistors 604. The calibration circuit 418, 600 may control the pull-up calibration transistors 604 based on the calibration resistor 602 (e.g. using the comparator 620, DAC counter 622, and VOH 606 as discussed above), and the calibration circuit may control the pull-up drivers (e.g. pull-up driver transistors 510) based on the control of the pull-up calibration transistors (e.g. based on the VOH 512, 606 that produces the output impedance 628 matching the impedance of the calibration resistor 420, 602 as discussed above).

The calibration circuit may comprise an output pulled up by the pull-up calibration transistors and loaded by the calibration resistor. The calibration circuit may further comprise a feedback circuit configured to control the pull-up calibration transistors based on the output of the calibration circuit. The feedback circuit may be configured to set an impedance of the parallel pull-up calibration transistors to the resistance of the calibration resistor. For instance, referring to FIGS. 4-6, the calibration circuit 418, 600 may include an output (e.g. VZQ 626) pulled up by the pull-up calibration transistors 604 and loaded by the calibration resistor 602. The calibration circuit 418, 600 may further include a feedback circuit which includes the pull-up calibration transistors and output (VZQ 626), the comparator 620, the DAC counter 622, and the VOH 606. The feedback circuit controls the pull-up calibration transistors 604 based on the output (e.g. using VOH 606), and may set an impedance of the parallel pull-up calibration transistors 604 (e.g. output impedance 628) to the resistance of the calibration resistor 602, as described above.

As represented by block 1004, the controller may determine whether the output impedance of the output driver can be calibrated to an impedance lower than a threshold at maximum temperature and minimum voltage. The threshold may be a function of a resistance of the calibration resistor. For instance, referring to FIGS. 4-6 and 8, the controller 123, 402 may determine whether the output impedance 422, 530 of the output driver 412, 502 can be calibrated to an impedance (e.g. 20 ohms) lower than a threshold (e.g. the above-described, minimum output impedance, such as 25 ohms) at maximum temperature and minimum voltage, e.g. as described in connection with blocks 804, 806, and 808 of FIG. 8. The threshold may be a function of a resistance of the calibration resistor 420, 602. For example, the minimum output impedance may change depending on the resistance of calibration resistor 602 (e.g. 25 ohms for a 300 ohm resistor, 30 ohms for a 360 ohm resistor, etc.)

Finally, as represented by block 1006, the controller may determine whether a calibration code exceeds a threshold at nominal temperature and voltage. The calibration circuit may be configured to generate the calibration code to calibrate the output impedance of the output driver using the calibration resistor. For instance, referring to FIGS. 4-6 and 9, the controller 123, 402 may determine whether a calibration code (e.g. the output of DAC counter 622) exceeds a threshold (e.g. a calibration code threshold) at nominal temperature and voltage (e.g. 1.2 VccQ for DDR3 and 25° C.), e.g., as described in connection with blocks 904 and 906 of FIG. 9.

The feedback circuit may generate the calibration code based on the output of the calibration circuit. The feedback circuit may further be configured to control the pull-up calibration transistors with the calibration code. The calibration circuit may be further configured to control the parallel pull-up driver transistors and the parallel pull-down driver transistors of the output driver with the calibration code. For instance, referring to FIGS. 4-6, the feedback circuit (e.g. the pull-up calibration transistors and output (VZQ 626), the comparator 620, the DAC counter 622, and the VOH 606) may generate the calibration code (e.g. the output of the DAC counter 622 corresponding to VOH 606) based on the output of the calibration circuit (e.g. VZQ 626). The feedback circuit may control the pull-up calibration transistors 604 with the calibration code (e.g. using VOH 606). The calibration circuit 418, 600 may control the parallel pull-up driver transistors 510 and the parallel pull-down driver transistors 518 of the output driver 412, 502 with the calibration code (e.g. using VOH 512, 606 and VOL 520, 610, which may correspond to the inverted output of the DAC counter 622).

Accordingly, the storage device described in the present disclosure allows under-driven, external (third-party) controllers to experience increased data output speeds without access to ZQ calibration codes, e.g., based on the results of the screening process described above with respect to FIG. 8, and internal controllers to experience increased data output speeds with access to ZQ calibration codes, e.g. based on the results of the screening process described above with respect to FIG. 9. Similarly, the capacity of the storage device may be bumped with higher die stacks for existing controllers (e.g. to 16 dies instead of 8 dies, based on a successful calibration to the lower output impedance), thereby improving storage device performance. Additionally, new controllers may operate at higher speeds based on the modified calibration resistor, without requiring over-design for worst-case high capacitance scenarios (e.g. without requiring a greater number of transistors to be implemented in increased die areas to handle higher die loads), thereby saving manufacturing costs. Moreover, various output driver strengths may be achieved that may suit signal integrity even if not supported by IC vendors. For instance, while the above description refers to the example where the output impedance may be calibrated to 20 ohms based on a 240 ohm calibration resistor, the output impedance may similarly be calibrated to other impedances (e.g. 30 ohms) based on other resistances for the calibration resistor (e.g. 260 ohms) that may not be supported across PVT variations, e.g. other than pre-configured driver strength settings of 25 ohms, 35 and/or 37.5 ohms, and 50 ohms.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
a calibration resistor; and
a die comprising
an output driver configured to output stored data, the output driver having an output impedance, and
a calibration circuit configured to calibrate the output impedance of the output driver using the calibration resistor, wherein the calibration resistor has a resistance that enables the calibration circuit to calibrate the output impedance to a lower impedance than a minimum impedance, the minimum impedance being required by a controller to read the stored data across process, voltage and temperature variations of the die at maximum loading of the controller.

2. The storage device of claim 1, further comprising the controller configured to command the calibration circuit to calibrate the output impedance.

3. The storage device of claim 1, wherein the output driver further comprises a plurality of parallel pull-up driver transistors and a plurality of parallel pull-down driver transistors, and wherein the calibration circuit is further configured to set an impedance of the parallel pull-up driver transistors and an impedance of the parallel pull-down driver transistors to the resistance of the calibration resistor.

4. The storage device of claim 3, wherein the output driver further comprises a plurality of parallel second pull-up driver transistors coupled in parallel with the pull-up driver transistors and a plurality of parallel second pull-down driver transistors coupled in parallel with the pull-down driver transistors, and wherein the calibration circuit is further configured to set an impedance of the parallel second pull-up driver transistor and an impedance of the parallel second pull-down driver transistor to the resistance of the calibration resistor.

5. The storage device of claim 1, wherein the output driver further comprises a plurality of parallel pull-up driver transistors and a plurality of parallel pull-down driver transistors, and wherein the calibration circuit is further configured to control the output impedance of the output driver by controlling the pull-up driver transistors and the pull-down driver transistors.

6. The storage device of claim 5, wherein the calibration circuit comprises a plurality of parallel pull-up calibration transistors, the calibration circuit being further configured to control the pull-up calibration transistors based on the calibration resistor and control the pull-up driver transistors based on the control of the pull-up calibration transistors.

7. The storage device of claim 6, wherein the calibration circuit comprises an output pulled up by the pull-up calibration transistors and loaded by the calibration resistor, the calibration circuit further comprising a feedback circuit configured to control the pull-up calibration transistors based on the output of the calibration circuit.

8. The storage device of claim 7, wherein the feedback circuit is configured to set an impedance of the parallel pull-up calibration transistors to the resistance of the calibration resistor.

9. A storage device, comprising:
a calibration resistor;
a die comprising
an output driver configured to output stored data, the output driver having an output impedance, and
a calibration circuit configured to calibrate the output impedance of the output driver using the calibration resistor; and
a controller configured to determine whether the output impedance of the output driver can be calibrated to an impedance lower than a threshold when the die has a maximum temperature and a minimum voltage.

10. The storage device of claim 9, wherein the calibration resistor has a resistance that would enable the calibration circuit to calibrate the output impedance to a lower impedance than a minimum impedance, the minimum impedance being required by the controller to read the stored data across process, voltage and temperature variations of the die at maximum loading of the controller.

11. The storage device of claim 9, wherein the controller is configured to command the calibration circuit to calibrate the output impedance.

12. The storage device of claim 9, wherein the threshold is a function of a resistance of the calibration resistor.

13. The storage device of claim 9, wherein the output driver further comprises a plurality of parallel pull-up driver transistors and a plurality of parallel pull-down driver transistors, and wherein the calibration circuit is further configured to set an impedance of the parallel pull-up driver transistors and an impedance of the parallel pull-down driver transistors to a resistance of the calibration resistor.

14. A storage device, comprising:
a calibration resistor;
a die comprising
an output driver configured to output stored data, the output driver having an output impedance, and
a calibration circuit configured to generate a calibration code to calibrate the output impedance of the output driver using the calibration resistor; and
a controller configured to determine whether the calibration code exceeds a threshold when the die has a nominal temperature and a nominal voltage.

15. The storage device of claim 14, wherein the calibration resistor has a resistance that would enable the calibration circuit to calibrate the output impedance to a lower impedance than a minimum impedance required by the controller to read the stored data across process, voltage and temperature variations of the die at maximum loading of the controller.

16. The storage device of claim 14, wherein the controller is configured to command the calibration circuit to calibrate the output impedance.

17. The storage device of claim 14, wherein the output driver further comprises a plurality of parallel pull-up driver transistors and a plurality of parallel pull-down driver transistors, and wherein the calibration circuit is further configured to set an impedance of the parallel pull-up driver transistors and an impedance of the parallel pull-down driver transistors to a resistance of the calibration resistor.

18. The storage device of claim 14, wherein the calibration circuit comprises an output loaded by the calibration resistor, a plurality of pull-up calibration transistors pulling up the output, and a feedback circuit configured to generate the calibration code based on the output of the calibration circuit.

19. The storage device of claim 18, wherein the feedback circuit is further configured to control the pull-up calibration transistors with the calibration code.

20. The storage device of claim 14, wherein the output driver further comprises a plurality of parallel pull-up driver transistors and a plurality of parallel pull-down driver transistors, and wherein the calibration circuit is further configured to control the parallel pull-up driver transistors and the parallel pull-down driver transistors with the calibration code.

* * * * *